United States Patent
Choi et al.

(10) Patent No.: US 7,602,010 B2
(45) Date of Patent: Oct. 13, 2009

(54) MULTI-BIT MULTI-LEVEL NON-VOLATILE MEMORY DEVICE AND METHODS OF OPERATING AND FABRICATING THE SAME

(75) Inventors: Byung-yong Choi, Suwon-si (KR); Tae-yong Kim, Suwon-si (KR); Eun-suk Cho, Suwon-si (KR); Suk-kang Sung, Seongnam-si (KR); Hye-jin Cho, Seongnam-si (KR); Dong-gun Park, Seongnam-si (KR); Choong-ho Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 43 days.

(21) Appl. No.: 11/407,133

(22) Filed: Apr. 19, 2006

(65) Prior Publication Data

US 2006/0249779 A1   Nov. 9, 2006

(30) Foreign Application Priority Data

May 6, 2005   (KR) ...................... 10-2005-0037848

(51) Int. Cl.
  *H01L 29/792* (2006.01)
(52) U.S. Cl. ........................ 257/324; 257/332; 257/390; 257/317; 257/E21.681; 257/E27.102; 257/E29.309
(58) Field of Classification Search ................. 257/316, 257/317, 319, 331, 332, E21.681, E21.682, 257/318, 320, 321, 390, 315, 324, E27.102, 257/E29.309; 438/267
See application file for complete search history.

(56) References Cited

U.S. PATENT DOCUMENTS

| | | | | |
|---|---|---|---|---|
| 5,350,937 | A | * | 9/1994 | Yamazaki et al. ........... 257/316 |
| 5,460,988 | A | * | 10/1995 | Hong .......................... 438/259 |
| 6,133,098 | A | | 10/2000 | Ogura et al. ................. 438/267 |
| 6,670,669 | B1 | | 12/2003 | Kawamura ................... 257/314 |
| 2002/0145161 | A1 | | 10/2002 | Miura et al. ................. 257/314 |
| 2004/0169219 | A1 | | 9/2004 | Miida et al. ................. 257/321 |
| 2005/0280094 | A1 | * | 12/2005 | Forbes ......................... 257/368 |

FOREIGN PATENT DOCUMENTS

JP   2004-214495   7/2004

* cited by examiner

*Primary Examiner*—Julio J. Maldonado
(74) *Attorney, Agent, or Firm*—Miles & Onello, LLP (57) ABSTRACT

In a non-volatile memory device allowing multi-bit and/or multi-level operations, and methods of operating and fabricating the same, the non-volatile memory device comprises, in one embodiment: a semiconductor substrate, doped with impurities of a first conductivity type, which has one or more fins defined by at least two separate trenches formed in the substrate, the fins extending along the substrate in a first direction; pairs of gate electrodes formed as spacers at sidewalls of the fins, wherein the gate electrodes are insulated from the semiconductor substrate including the fins and extend parallel to the fins; storage nodes between the gate electrodes and the fins, and insulated from the gate electrodes and the semiconductor substrate; source regions and drain regions, which are doped with impurities of a second conductivity type, and are separately formed at least at surface portions of the fins and extend across the first direction of the fins; and channel regions corresponding to the respective gate electrodes, formed at least at surface regions of the sidewalls of the fins between the source and the drain regions.

13 Claims, 8 Drawing Sheets

MULTI-BIT MULTI-LEVEL NON-VOLATILE MEMORY DEVICE AND METHODS OF OPERATING AND FABRICATING THE SAME

CROSS-REFERENCE TO RELATED PATENT APPLICATION

This application claims priority to Korean Patent Application No. 10-2005-0037848, filed on May 6, 2005, in the Korean Intellectual Property Office, the disclosure of which is incorporated herein in its entirety by reference.

BACKGROUND OF THE INVENTION

1. Field of the Invention

The present invention relates to a semiconductor memory device, and more particularly, to a multi-bit and multi-level non-volatile memory device and methods of operating and fabricating the same.

2. Description of the Related Art

A non-volatile memory device, for example, a flash memory device, includes a conductive floating gate between a control gate and a semiconductor substrate. The floating gate is used as a storage node for storing electric charge. The flash memory operates by forming a conductive channel, i.e. a current flow, in a semiconductor substrate using induced change in threshold voltage which in turn corresponds to electric charge stored in the floating gate.

Meanwhile, a Silicon-Oxide-Nitride-Oxide-Silicon (SONOS) based memory device, another type of non-volatile memory device, includes a trap-type storage node positioned between a control gate and a semiconductor substrate. The operation of the SONOS memory is similar to that of the flash memory.

Because of limitations of micro-pattern processing technologies for manufacturing non-volatile memory devices, however, increase in the capacity and operation speed memory devices reach design limits. Accordingly, alternative approaches for increasing the capacity and operation speed of memory device are the focus of ongoing research.

An example of one approach is a structure having two-sidewall floating gates formed on both sidewalls of a word line select transistor disclosed in U.S. Pat. No. 6,133,098 by Seiki Ogura et al. entitled "PROCESS FOR MAKING AND PROGRAMMING AND OPERATING A DUAL-BIT MULTI-LEVEL BALLISTIC FLASH MEMORY", incorporated herein by reference. The dual-sidewall floating gates, formed adjacent to a word line, share a bit line and a source, and do not require an element isolating region, thereby increasing device integration. In addition, a multi-level program operation, which has a plurality of threshold voltage levels by controlling a bit line voltage, can be performed. However, the flash memory disclosed by Seiki Ogura et. al has drawbacks in that the operations of the two-sidewall floating gates are limited to 2-bit mode and the reduction in the width of a word line select gate is limited to suppress the short channel effect.

An example of another approach is a multiple-bit non-volatile memory using a non-conductive trapping gate disclosed in U.S. Pat. No. 6,670,669 by Shoichi Kawamura et al. entitled "MULTIPLE-BIT NON-VOLATILE MEMORY UTILIZING NON-CONDUCTIVE CHARGE TRAPPING GATE", incorporated herein by reference. The non-volatile memory device disclosed by Shoichi Kawamura et al. can perform multi-bit operations by locally storing electric charge in several places of a non-conductive trapping gate. However, the non-volatile memory device disclosed by Shoichi Kawamura et al. cannot effectively suppress the short channel effect because of the use of a planar-type transistor structure, and thus, cannot readily reduce the length of the control gates. Thus, the device of Shoichi Kawamura et al. is likewise limited in its ability to increase the integration of a memory device.

SUMMARY OF THE INVENTION

The present invention provides a non-volatile memory device, which allows multi-bit and/or multi-level operations and suppresses the short channel effect.

The present invention also provides a method for multi-bit and/or multi-level operations of a non-volatile memory device.

The present invention also provides a method of fabricating a multi-bit and multi-level non-volatile memory device.

In one aspect, the present invention is directed to a non-volatile memory device including: a semiconductor substrate, doped with impurities of a first conductivity type, which has one or more fins defined by at least two separate trenches formed in the substrate, the fins extending along the substrate in a first direction; pairs of gate electrodes formed as spacers at sidewalls of the fins, wherein the gate electrodes are insulated from the semiconductor substrate including the fins and extend parallel to the fins; storage nodes between the gate electrodes and the fins, and insulated from the gate electrodes and the semiconductor substrate; source regions and drain regions, which are doped with impurities of a second conductivity type, and are separately formed at least at surface portions of the fins and extend across the first direction of the fins; and channel regions corresponding to the respective gate electrodes, formed at least at surface regions of the sidewalls of the fins between the source and the drain regions.

In one embodiment, the device further comprises oxide films between the storage nodes and the adjacent gate electrodes, and between the storage nodes and the semiconductor substrate.

In another embodiment, the storage nodes are formed of a material capable of storing electric charge comprising one selected from the group consisting of a polysilicon film, a silicon germanium film, a silicon dot, a metal dot, a silicon nitride film, a hafnium oxide film, an aluminum oxide film and nano crystals.

In another embodiment, the source regions and the drain regions are further formed at portions of the surface of the semiconductor substrate, and are connected to and extend across the fins.

In another embodiment, the channel regions are further formed at a surface region of the semiconductor substrate below the gate electrodes.

In another embodiment, the storage nodes are further formed between the gate electrodes and the semiconductor substrate, so that the storage nodes have an 'L' shaped cross-section.

In another embodiment, the storage nodes are further formed as a common layer on the semiconductor substrate having the fins.

In another embodiment, the storage nodes are insulated from the gate electrodes and the semiconductor substrate by silicon oxide films formed on and under the storage nodes.

In another aspect, the present invention is directed to a non-volatile memory device comprising: a semiconductor substrate, doped with impurities of a first conductivity type, which has one or more fins defined by at least two separate trenches, the fins protruding from a top portion of the substrate and extending along the substrate in a first direction;

pairs of gate electrodes formed as spacers at sidewalls of the fins, wherein the gate electrode are insulated from the semiconductor substrate including the fins and extend parallel to the fins; storage nodes having an 'L' shaped cross-section between the gate electrodes and the fins, and insulated from the gate electrodes and the semiconductor substrate; source regions and drain regions, which are doped with impurities of a second conductivity type, and are separately formed at surface portions of the semiconductor substrate including at least the fins and extend across the first direction of the fins; and channel regions formed at surface regions of the sidewalls of the fins between pairs of the source and the drain and on surface regions of the semiconductor substrate.

In one embodiment, the device further comprises oxide films between the storage nodes and the adjacent gate electrodes, and between the storage nodes and the semiconductor substrate.

In another embodiment, the storage nodes are formed of a material capable of storing electric charge comprising one selected from the group consisting of a polysilicon film, a silicon germanium film, a silicon dot, a metal dot, a silicon nitride film, a hafnium oxide film, an aluminum oxide film and nano crystals.

In another embodiment, the storage nodes are further formed as a common layer on the semiconductor substrate having the fins.

In another embodiment, the storage nodes are insulated from the gate electrodes and the semiconductor substrate by silicon oxide films formed on and under the storage nodes.

In another aspect, the present invention is directed to a method of operating a non-volatile memory device comprising: performing writing and erasing operations by injecting electric charge into and extracting electric charge from the first storage node using one of the source and drain regions as a bit line and selectively using one of the gate electrodes as a word line; and performing a reading operation by reading a threshold voltage of the channel region below the gate electrode.

In one embodiment, the reading operation is a multi-bit reading operation performed by reading a threshold voltage of one of the first and second channel regions by applying voltages to one of the gate electrodes and applying forward and reverse voltages between the source region and the drain region.

In another embodiment, the reading operation is reading a threshold voltage of the channel region below one of the gate electrode in multi-level by applying a read voltage to one of the gate electrode, a bias voltage in multi-level to the other gate electrode.

In another aspect, the present invention is directed to a method of fabricating a non-volatile memory device comprising: forming one or more fins defined by at least the two trenches by forming at least two separately formed trenches in a semiconductor substrate doped with impurities of a first conductivity type, the fins extending along the substrate in the first direction; forming source regions and drain regions in the fins by doping predetermined regions of the semiconductor substrate having the fins with impurities of a second conductivity type, wherein the source regions and the drain regions are formed separately with respect to the first direction of extension of the fins and extend across the first direction of the fins on the semiconductor substrate; forming a first insulation layer on the semiconductor substrate having the source regions and the drain regions; forming a storage node layer on the first insulation layer; forming a second insulation layer on the storage node layer; forming a gate electrode layer on the second insulation layer; and forming pairs of gate electrodes as spacers at sidewalls of the one or more fins by anisotropically etching the gate electrode layer.

In one embodiment, the method further comprises forming pairs of storage nodes having L-shaped cross-sections between first and second insulation layers between the gate electrodes and the semiconductor substrate having the one or more fins by selectively etching the exposed second insulation layer, the storage node layer, and the first insulation layer using the gate electrodes as an etching mask after forming the gate electrodes.

In another embodiment, forming the gate electrodes further comprises selectively etching both ends of a remainder of the gate electrode layer after anisotropically etching the gate electrode layer.

In another embodiment, the storage node layers are formed of one of polysilicon, silicon germanium, silicon dots, metal dots, a silicon nitride film, a hafnium oxide film, an aluminum oxide film and nano crystals.

In another embodiment, forming the source regions and the drain regions comprises forming a photoresist pattern exposing a predetermined region and ion-implanting the impurities of a second conductivity type using the photoresist pattern as a protection mask.

In another embodiment, the impurities of a second conductivity type are implanted with an angle of incidence of greater than 0° and less than 90° with respect to the semiconductor substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather these embodiments are provided so that this disclosure will be thorough and compete. In the drawings, the thicknesses of layers and regions are exaggerated for clarity.

Figure 1A:
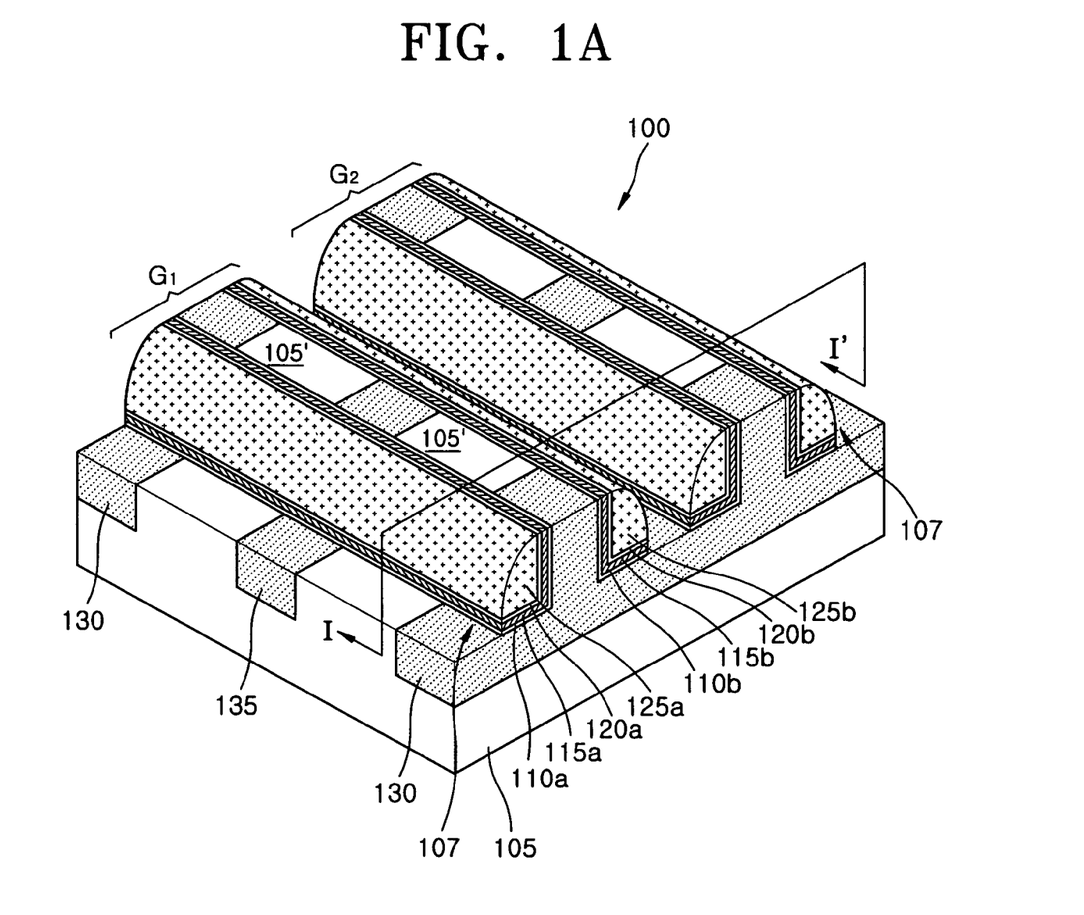
FIG. 1A is a perspective view of a non-volatile memory device according to a first embodiment of the present invention.
Figure 1B:
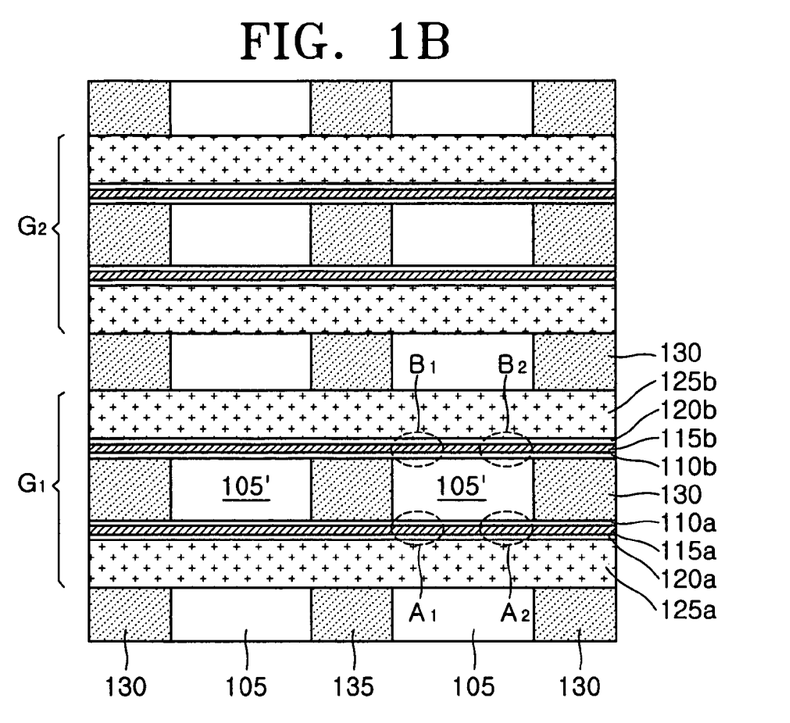
FIG. 1B is a plan view of the non-volatile memory device of FIG. 1A.
Figure 1C:
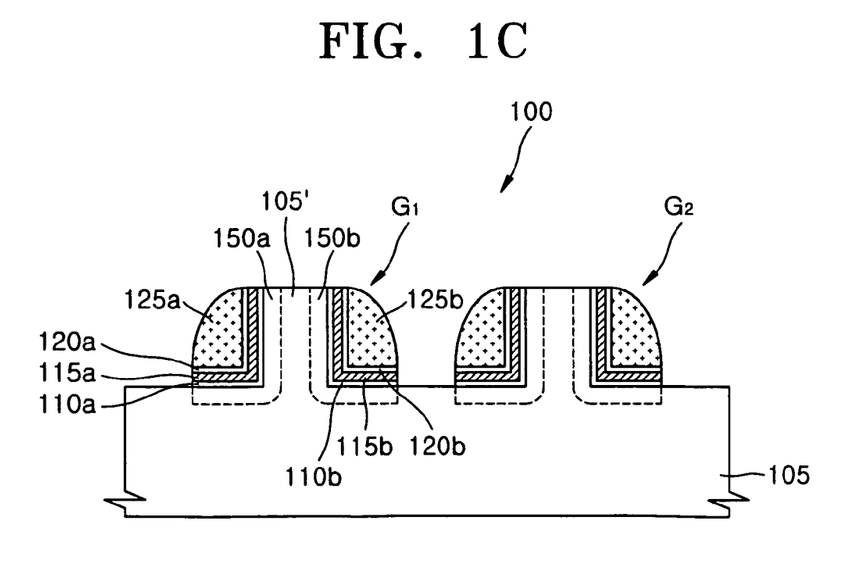
FIG. 1C is a cross-sectional view along section line I-I' in the non-volatile memory device of FIG. 1A.

A non-volatile memory device 100 according to a first embodiment of the present invention will now be described in detail with reference to FIGS. 1A through 1C. FIG. 1A is a perspective view of the non-volatile memory device 100 according to a first embodiment of the present invention. FIG. 1B is a plan view of the non-volatile memory device 100 of FIG. 1A. FIG. 1C is a cross-sectional view along section line I-I' in the non-volatile memory device 100 of FIG. 1A.

Referring to FIGS. 1A through 1C, the non-volatile memory device 100 includes gate structures G1 and G2 above a semiconductor substrate 105 having fins 105', source regions 130 and drain regions 135 separately formed by doping the semiconductor substrate 105 with impurities, and channel regions 150a and 150b in the predetermined regions of the semiconductor substrate 105.

The semiconductor substrate 105 may be formed of, for example, bulk silicon (Si), bulk silicon germanium (SiGe), a silicon epi-layer, a silicon germanium epi-layer, a silicon on insulator (SOI), or a combination of these materials. The semiconductor substrate 105 is doped with impurities of a first conductivity type, either n-type impurities or p-type impurities. For example, the n-type impurities are arsenic (As) or phosphorus (P), and the p-type impurities are boron (B) or boron di-fluoride ($BF_2$). The semiconductor substrate 105 in FIG. 1 may further include active regions and element isolating regions (not illustrated) surrounding the active region.

The semiconductor substrate 105 includes a plurality of fins 105' protruding therefrom, and two fins 105' are illustrated in FIG. 1 as an example. The two fins 105' are separately formed. The two fins 105' can be formed as straight line patterns having a length extending in one direction and a width extending in the direction normal to the direction of the length.

The fins 105' can be defined by at least two trenches 107, and more specifically, the sidewalls of each fin 105' can be defined by two trenches 107. For example, the fins 105' can be defined with trenches 107 formed by etching bulk silicon or by etching a silicon epi-layer or a silicon germanium epi-layer formed on bulk silicon. In other words, the fin 105' can be made of the same or different semiconductor material as the semiconductor substrate 105.

The source regions 130 and the drain regions 135 may be separately and alternately formed in the semiconductor substrate 105 having the fins 105'. The source regions 130 and the drain regions 135 are formed parallel to each other and extend across the fins 105'. Sources and drains of the fin 105' arranged in columns or in rows are connected to each other. The source regions 130 or the drain regions 135 can be used as a bit line of the non-volatile memory device 100 and a common bit line of the fins 105'. Accordingly, a wire structure connecting the bit lines to each other in the fins 105' is not necessary, thereby increasing integration of a device. In a modification of the first embodiment of the present invention, the source regions 130 and the drain regions 135 could be formed exclusively in the fins 105', which would require wires connecting bit lines to each other in the fins 105'.

The source regions 130 and the drain regions 135 are doped with impurities of a second conductivity type, being of a different type from that of the impurities of a first conductivity type. If, the impurities of a first conductivity type are p-type impurities, the impurities of a second conductivity type should be n-type impurities, and vice-versa.

Since first and second gate structures G1 and G2 are similar to each other, the first gate structure G1 will be described as an example. The first gate structure G1, insulated from the semiconductor substrate 105, includes pairs of storage nodes 115a and 115b insulated from each other and pairs of gate electrodes 125a and 125b insulated from each other. First insulation layers 110a and 110b are formed between the storage nodes 115a and 115b and the semiconductor substrate 105, respectively. Second insulation layers 120a and 120b are formed between the storage nodes 115a and 115b and gate electrodes 125a and 125b, respectively.

The storage nodes 115a and 115b are formed on the sidewalls of the fin 105' and a portion of the surface of the semiconductor substrate 105 as an 'L' shape. The storage nodes 115a and 115b store electric charge, and are formed as, for example, floating nodes or electric charge trapping layers. More specifically, the electric charge trapping layers are formed of, for example, silicon nitride films, hafnium oxide films, aluminum oxide films, silicon dots, metal dots, or nanocrystals. Polysilicon films and silicon germanium films can be used for conductive floating nodes.

The gate electrodes 125a and 125b are separately formed as spacers at both sidewalls of the fins 105'. The gate electrodes 125a and 125b can be used as control gates or word lines. The gate electrodes 125a and 125b are formed of, for example, polysilicon, metal, metal silicide or combinations of these materials.

The first insulation layers 110a and 110b are formed of, for example, silicon oxide films. The second insulation layers 120a and 120b are formed of, for example, silicon oxide films, high-dielectric metal films, or silicon oxide film/silicon nitride film/silicon oxide (ONO) films.

The channel regions 150a and 150b are formed below the gate electrodes 125a and 125b on the surfaces of sidewall regions of the fins 105' and the surfaces of the semiconductor substrate 105 between the source regions 130 and the drain regions 135. The channel regions 150a and 150b operate as current pathways between the source regions 130 and the drain regions 135, when a turn-on voltage is applied to the gate electrodes 125a and 125b. The channel regions 150a and 150b can have different impurity concentrations from that of the semiconductor substrate 105 so as to control threshold voltages. Since the channel regions 150a and 150b are formed on the sidewalls of the fins 105' between the source regions 130 and the drain regions 135, a short channel effect can be suppressed by controlling the distance between the source regions 130 and the drain regions 135, and the width of the fins 105'. If the widths of fins 105' are sufficiently thin, the short channel effect can be suppressed through the thin body effect, which is well known to those skilled in the art.

Although not illustrated in the drawings, the non-volatile memory device 100 can further include metal wire structures connected to the gate electrodes 125a and 125b, the source regions 130, and the drain regions 135. The integration density of the non-volatile memory device 100 can be increased by forming a bit line-shared structure and the short channel effect of the non-volatile memory device 100 can be reduced in accordance with the thin body effect.

Hereinafter, a method of operating the non-volatile memory device 100 will be described in detail.

When the non-volatile memory device 100 operates, the source regions 130 or the drain regions 135 can be used as a bit line and one of the gate electrodes 125a and 125b is selectively used as a word line. When the first gate electrode 125a is selected as a word line, writing and erasing operations can be performed by injecting electric charge, i.e. electrons or holes, into and extracting electric charge from the first storage node 115a and a reading operation can be performed by reading the threshold voltage of the first channel region 150a. Accordingly, when the second gate electrode 125a is selected as a word line, the writing, erasing, and reading operations can be performed using the second storage node 115b and the second channel region 150b.

Accordingly, the non-volatile memory device 100 allows writing, erasing and reading operations of 2 bits or more by selecting one word line from two gate electrodes 125a and 125b with respect to one bit line. The 2-bit operation is a combination of writing and erasing states using two storage nodes 115a and 115b, which indicates a 4-level state.

In addition, the non-volatile memory device 100 allows multi-bit operation of more than 4 bits. More specifically, electric charge can injected into the regions A1, A2, B1, and B2 of the storage nodes 115a and 115b that are adjacent to the source region 130 and the drain region 135 to write multi-bit data. For example, by applying a high voltage to one of the first and second gate electrodes 125a and 125b, applying a writing voltage to one region selected from the source region 130 and the drain region 135, and applying a ground voltage to the other region, electric charge, for example, electrons from either of the first and second channel regions 150a and 150b are injected into one of the first and second storage nodes 115a and 115b. Here, the unselected gate electrode between the first and second gate electrodes 125a and 125b may float during the writing operation.

In detail, a first writing operation, in which electrons are injected into the first storage node 115a included in a region A1 adjacent to the drain region 135, can be performed by applying a high voltage to the first gate electrode 125a, a writing voltage to the drain region 135, and a ground voltage to the source region 130. A second writing operation, in which electrons are injected into the first storage node 115a included in a region A2 adjacent to the source region 130, can be performed by applying a high voltage to the first gate electrode 125a, a writing voltage to the source region 135, and a ground voltage to the drain region 130. A third writing operation, in which electrons are injected into the second storage node 115b included in a region B2 adjacent to the source region 130, can be performed by applying a high voltage to the second gate electrode 125b, a writing voltage to the source region 135, and a ground voltage to the drain region 130. A fourth writing operation, in which electrons are injected into the second storage node 115b included in a region B1 adjacent to the drain region 135, can be performed by applying a high voltage to the second gate electrode 125b, a writing voltage to the drain region 135, and a ground voltage to the source region 130. Here, the electrons injected into the storage nodes 115a and 115b may be channel hot electrons generated in and moved from the channels.

Meanwhile, an erasing operation, in which electric charge is extracted from one of the first and second storage nodes 115a and 115b, is performed by applying a high reverse-directional voltage with respect to that in the writing operation to one of the first and second gate electrodes 125a and 125b, applying an erasing voltage to one of the source region 130 and the drain region 135, and applying a ground voltage to the other of the source region 130 and the drain region 135. Accordingly, hot holes generated by a band-to-band tunneling effect are moved toward the storage nodes 115a and 115b adjacent to the impurity region where the erasing voltage is applied, and recombined with electrons, resulting in extracting electric charge from the storage nodes 115a and 115b. Here, the unselected gate electrode between the first and second gate electrodes 125a and 125b may float during the erasing operation.

By injecting electric charge into and extracting electric charge from the storage nodes 115a and 115b in the regions A1, A2, B1, and B2 adjacent to the source region 130 and the drain region 135, threshold voltages of the channel regions 150a and 150b under the storage nodes 115a and 115b in the regions A1, A2, B1, and B2 are changed. Since reading currents in the channel regions 150a and 150b change corresponding to changes in the threshold voltages, data stored in the storage nodes 115a and 115b can be sensed by the reading currents.

A first reading operation for reading data stored in the first storage node 115a in the region A1 can be performed by applying a reading voltage to the source region 130, a control voltage to the first gate electrode 125a, and a ground voltage to the drain region 135. That is, the data states can be sensed by sensing a current flowing through the first channel region 150a, when the voltages are applied. The control voltage may be higher than the threshold voltage of the first channel region 150a when electric charge is extracted from the first storage node 115a and lower than the threshold voltage of the first channel region 150a when electric charge is injected into the first storage node 115a.

A second reading operation for reading data stored in the first storage node 115a in the region A2 can be performed by applying a reading voltage to the drain region 135, a control voltage to the first gate electrode 125a, and a ground voltage to the source region 130. Accordingly, the direction of current flowing through the first channel region 150a in the second reading operation is opposite to that in the first reading operation.

A third reading operation for reading data stored in the second storage node 115b in the region B1 can be performed by applying a reading voltage to the source region 130, a control voltage to the second gate electrode 125b, and a ground voltage to the drain region 135. The direction of current flowing through the second channel region 150b in the third reading operation is the same as that in the first reading operation.

A fourth reading operation for reading data stored in the second storage node 115b in the region B2 can be performed by applying a reading voltage to the drain region 135, a control voltage to the second gate electrode 125b, and a ground voltage to the source region 130. The direction of current flowing through the second channel region 150b in the fourth reading operation is opposite to that in the third reading operation. Here, the unselected gate electrode between the first and second gate electrodes 125a and 125b may float during the reading operation.

Accordingly, reading a threshold voltage of one of the first and second channel regions 150a and 150b by applying voltages to one of the gate electrodes 125a and 125b and applying voltages in a forward/backward direction to the source region 130 and the drain region 135 allows multi-bit sensing of data states in the storage nodes 115a and 115b.

Therefore, the non-volatile memory device according to an embodiment of the present invention can perform multi-bit writing, erasing, and reading operations.

The non-volatile memory device 100 according to an embodiment of the present invention can perform multi-level operations as well as multi-bit operations described above. More specifically, a reading voltage is applied to one gate electrode, for example, the first gate electrode 125a, and a multi-level bias voltage is applied to the second gate electrode 125b such that a threshold voltage of a first channel region 150a has multiple levels. Accordingly, multi-level data stored in the first storage node 115a can be read.

Since the gate electrodes 125a and 125b share one fin 105', it is possible to be a multi-level threshold voltage and multi-level read data. That is, the application the bias voltage to the second gate electrode 125b increases/decreases the electric potential of the fin 105', which is similar to the direct application of the bias voltage to the fin 105'. Such influence of applying a bias voltage is more effective in a structure having the relatively thin fins 105' than in a structure having a bulk substrate. Consequently, the first channel region 150a can have a multi-level threshold voltage by applying the bias voltage to the second gate electrode 125b. Therefore, the non-volatile memory device 100 according to the embodiment of the present invention can perform multi-bit and/or multi-level operations.

The effect of a multi-level threshold voltage in a shared body can be referred to in the descriptions of "Flexible Threshold Voltage FinFETs with Independent Double Gates and an Ideal Rectangular Cross-Section Si-Fin Channel" by Y. X. Liu, IEDM 2003, incorporated herein by reference.

Figure 2A:
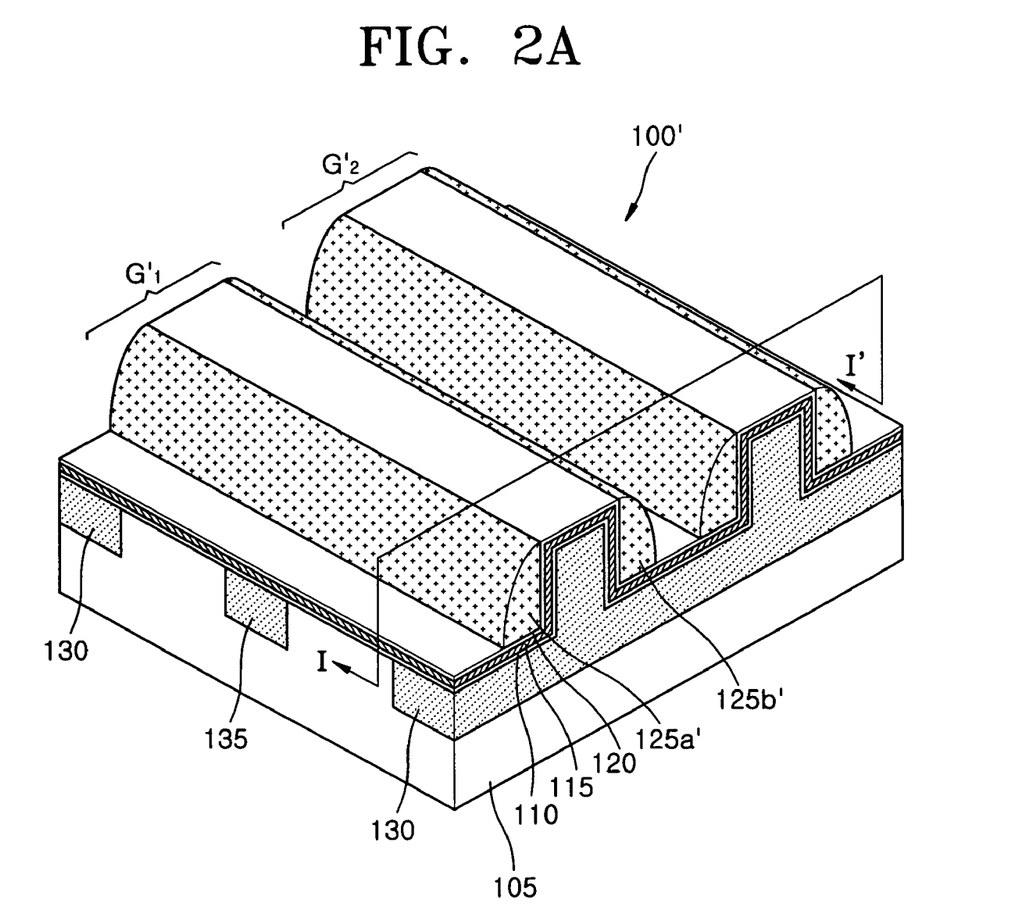
FIG. 2A is a perspective view of a non-volatile memory device according to a second embodiment of the present invention.
Figure 2B:
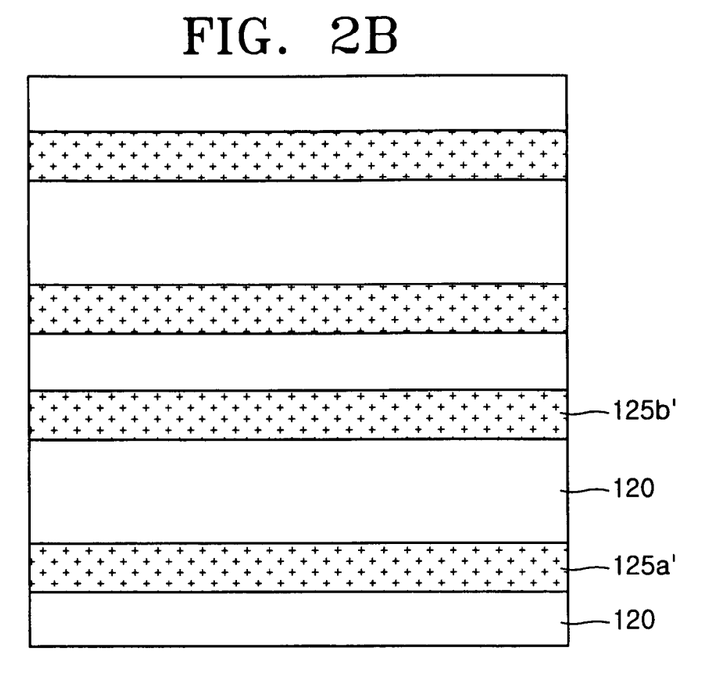
FIG. 2B is a plan view of the non-volatile memory device of FIG. 2A.
Figure 2C:
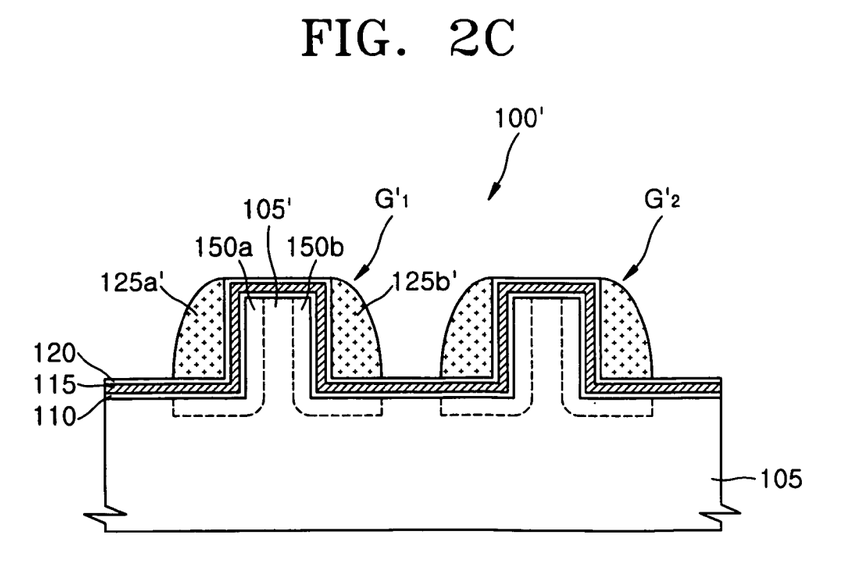
FIG. 2C is a cross-sectional view along section line I-I' in the non-volatile memory device of FIG. 2A.

Hereinafter, a non-volatile memory device 100' according to a second embodiment of the present invention will be described in detail with reference to FIGS. 2A through 2C. FIG. 2A is a perspective view of the non-volatile memory device 100' according to the second embodiment of the present invention. FIG. 2B is a plan view of the non-volatile memory device 100' of FIG. 2A. FIG. 2C is a cross-sectional view along section line I-I' in the non-volatile memory device 100' of FIG. 2A. The non-volatile memory device 100' is a modification of the non-volatile memory device 100 according to the first embodiment of the present invention, and thus FIG. 1 and the previous descriptions thereof can be referred to. Like reference numerals in the drawings denote like elements.

Referring to FIGS. 2A through 2C, gate structures G1' and G2' share a storage node 115. That is, a first gate electrode 125a' and a second gate electrode 125b' share the storage node 115, and accordingly first and second insulation layers 110 and 120 extend along both sides of the storage node 115. Accordingly, the storage node 115 and the first and second insulation layers 110 and 120 are also formed above the source regions 130 and the drain regions 135.

The storage node 115 may be formed as an electric charge trap layer locally storing electric charge corresponding to the gate electrodes 125a' and 125b'. The storage node 115 is formed of, for example, a silicon nitride film, a hafnium oxide film, an aluminum oxide film, silicon dots, metal dots or nano crystals. The structure of the non-volatile memory device 100' of the second embodiment of the present invention is simpler that that of the non-volatile memory device 100 of the first embodiment of the present invention, thereby reducing its manufacturing cost.

The structure and the operation for the non-volatile memory device 100' are similar to those of the non-volatile memory device 100 according to the first embodiment of the present invention expect for the above-described points. Thus, redundant descriptions are omitted.

Figure 3A:
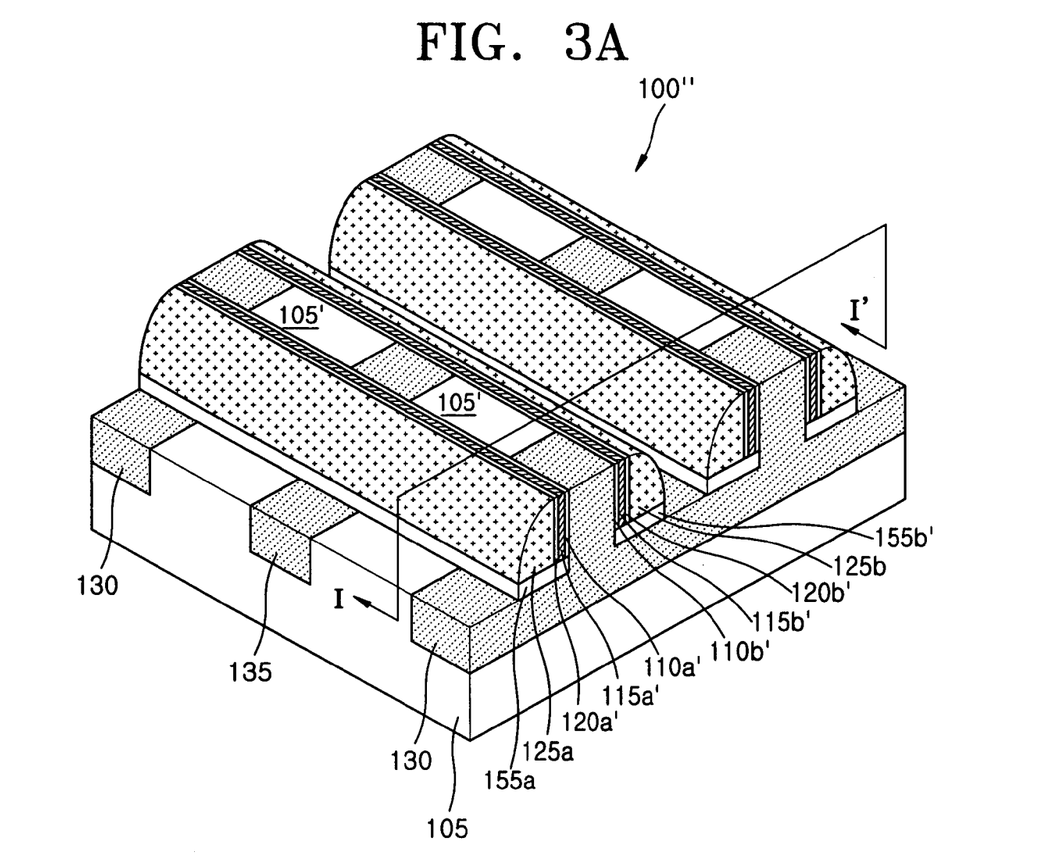
FIG. 3A is a perspective view of a non-volatile memory device according to a third embodiment of the present invention.
Figure 3B:
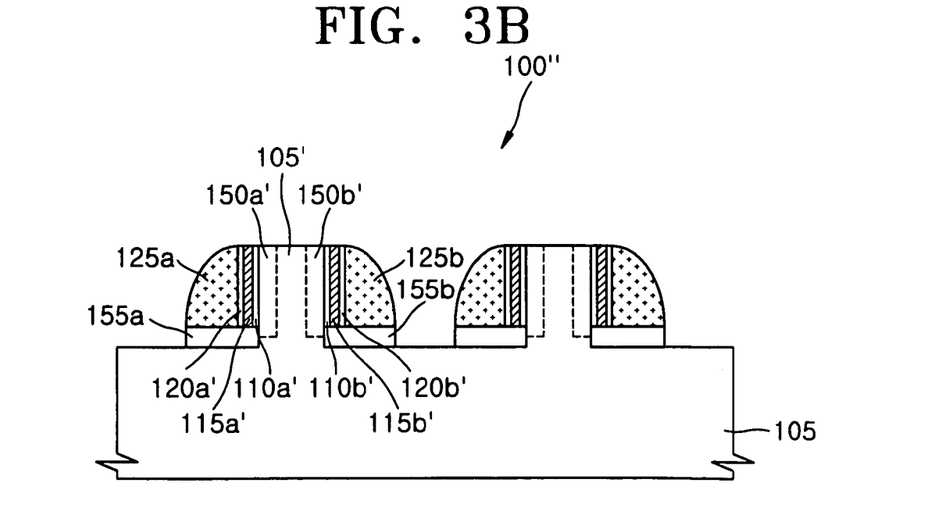
FIG. 3B is a cross-sectional view along section line I-I' in the non-volatile memory device of FIG. 3A.

Hereinafter, a non-volatile memory device 100" according to a third embodiment of the present invention will be described in detail with reference to FIGS. 3A and 3B. FIG. 3A is a perspective view of the non-volatile memory device 100" according to a third embodiment of the present invention. FIG. 3B is a cross-sectional view along section line I-I' in the non-volatile memory device 100" of FIG. 3A. The non-volatile memory device 100" is a modification of the non-volatile memory device 100 according to the first embodiment of the present invention, thus FIG. 1 and the previous descriptions thereof can be referred to. Like reference numerals in the drawings denote like elements.

Referring to FIGS. 3A and 3B, storage nodes 115a' and 115b' are formed between first insulation layers 110a' and 110b' formed at the sidewalls of a fin 105' and the second insulation layers 120a' and 120b' formed at the sidewalls of the gate electrodes 125a and 125b. That is, the storage nodes 115a' and 115b' are formed only at the sidewalls of each of the fins 105'. The storage nodes 115a' and 115b' store electric charge and are formed of, for example, floating nodes or trapping layers. Third insulation layers 155a and 155b are formed between the gate electrodes 125a and 125b and the surface of the semiconductor substrate 105. The third insulation layers 155a and 155b can be formed using silicon oxide films.

Channel regions 150a' and 150b' are formed at the sidewalls of the fin 105'. The thicknesses of materials of the third insulation layers 155a and 155b can be controlled so that the channel regions are not formed in portions of the semiconductor substrate 105 below the gate electrodes 125a and 125b. The vertical channel regions 150a' and 150b' enhance the thin body effect, resulting in further effectively suppressing the short channel effect.

The structure and the operation for the non-volatile memory device 100" are similar to those of the non-volatile memory device 100 according to the first embodiment of the present invention except for the above-described points. Thus, redundant descriptions are omitted.

Hereinafter, a method of fabricating a non-volatile memory device 100 according to the first embodiment of the present invention will be described in detail with reference to FIGS. 4 through 8. FIGS. 4 through 8 are perspective views sequentially illustrating a method of fabricating the non-volatile memory device 100 according to the first embodiment of the present invention.

Figure 4:
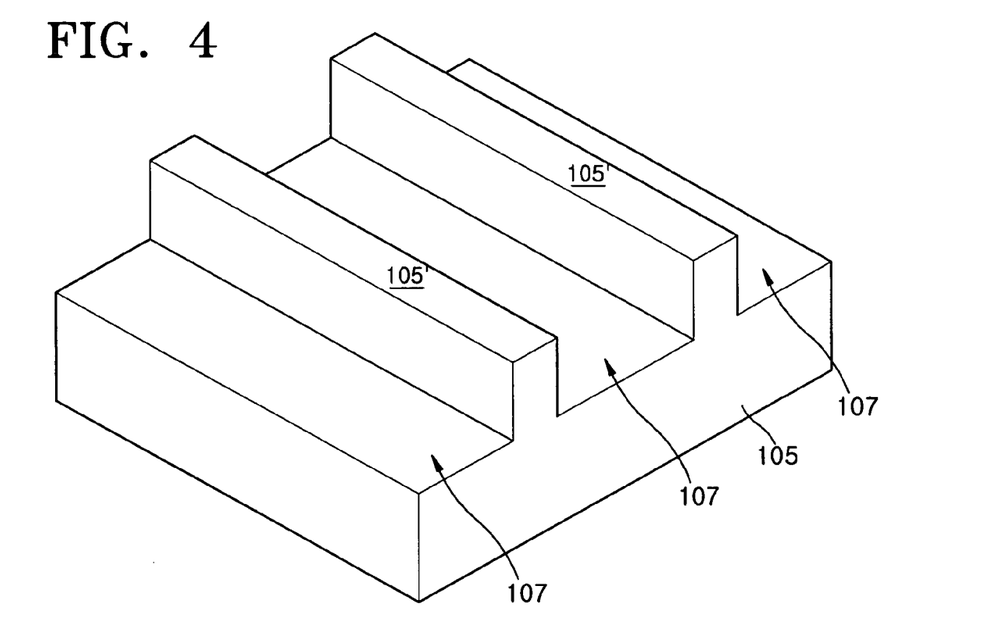
FIGS. 4 through 8 are perspective views sequentially illustrating a method of fabricating a non-volatile memory device according to the first embodiment of the present invention.

Referring to FIG. 4, at least two trenches 107 are separately formed in a semiconductor substrate 105 doped with impurities of a first conductivity type. Accordingly, one or more fins 105' are defined by the at least two trenches 107. In detail, a first photoresist pattern or a hard mask pattern (not illustrated) covering the fins 105' while exposing predetermined regions for forming trenches 107 is formed above the semiconductor substrate 105. Next, the semiconductor substrate 105 is anisotropically etched to a predetermined depth using the first photoresist pattern or the hard mask pattern as an etching mask, thereby forming the trenches 107.

The semiconductor substrate 105 may be made of bulk silicon, bulk silicon germanium, a silicon epi-layer, a silicon germanium epi-layer, SOI, or a combination of these materials. If the semiconductor substrate 105 has a structure of a silicon epi-layer formed on a bulk silicon substrate, the fins 105' may be formed of the silicon epi-layer. The surface regions of the sidewalls of the fins 105' and the surface regions of the semiconductor substrate 105 can be used for channel regions, and the other surfaces of the fins 105' and the other surfaces of the semiconductor substrate 105 can be used for the source regions 130 (see FIG. 5) and the drain regions 135 (see FIG. 5).

Although not illustrated in the drawings, element isolating regions (not illustrated) 105 can be formed in the semiconductor substrate before forming the trenches 107. Accordingly, active regions can be defined on the semiconductor substrate 105. The element isolating regions can be formed according to conventional methods well known to those skilled in the art. For example, the element isolating regions can be formed as shallow trench isolation (STI) films.

Figure 5:
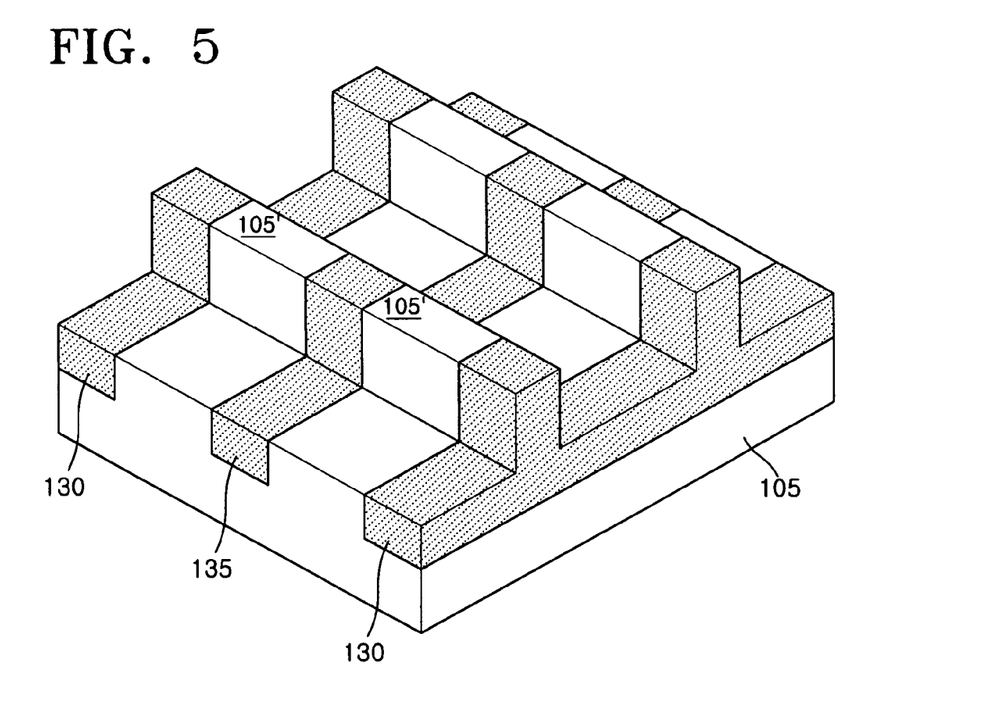

Referring to FIG. 5, a photoresist pattern (not illustrated) exposing predetermined regions is formed above the semiconductor substrate 105 having the fins 105', and the exposed semiconductor substrate from the photoresist pattern is doped with impurities of a second conductivity type (not illustrated), thereby forming source regions 130 and drain regions 135, separate form each other and extending normal to the extending direction of the fins 105' and across the fins 105', on the surface of the fins 105' and the surface of the semiconductor substrate 105. If the impurities of a first conductivity type are p-type impurities, the impurities of a second conductivity type can be n-type impurities, or vice versa.

The impurities of a second conductivity type can be implanted by using an ion implantation method. To obtain a uniform ion implantation in the fin 105' and the semiconductor substrate 105, a tilted angle ion implantation can be employed. Specifically, the angle of incidence of second conductivity type impurities for the ion implantation is greater than 0° and smaller than 90° with respect to the semiconductor substrate 105. More specifically, the angle of incidence of second conductivity type impurities for the ion implantation may be from 20° to 50°, and, in this case, the ion implantation can be performed on both sidewalls of the fin 105' so as to maintain a symmetry of the implantation.

Figure 6:
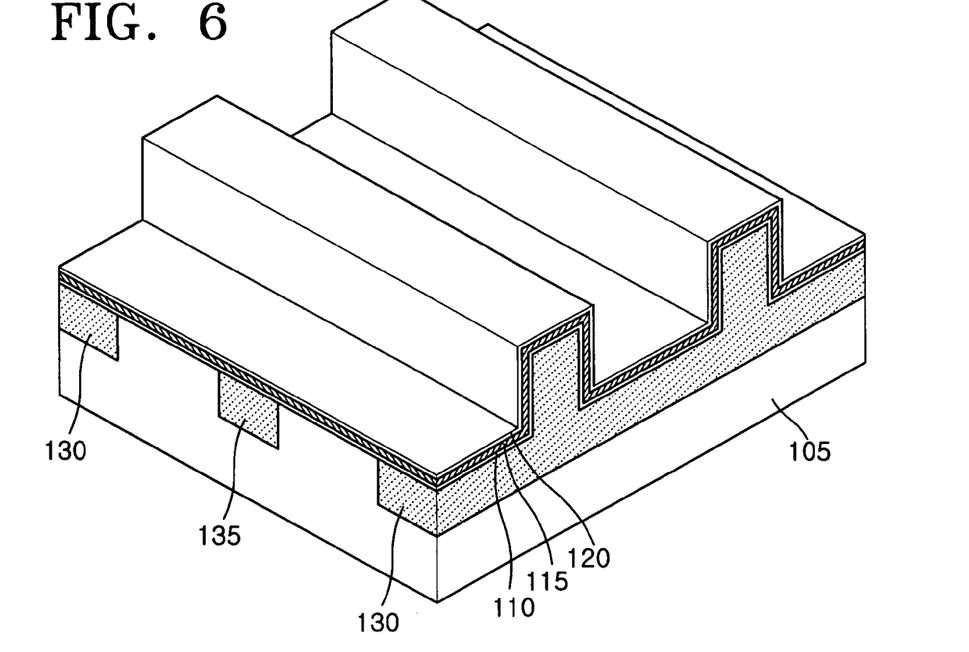

Referring to FIG. 6, a first insulation layer 110, a storage node layer 115, and a second insulation layer 120 are sequentially formed above the semiconductor substrate 105 on which the source regions 130 and the drains 135 are formed. The first and second insulation layers 110 and 120 may be formed of silicon oxide films or other insulation films using a conventional material deposition method, such as chemical vapor deposition (CVD).

The storage node layer 115 is formed of, for example, a polysilicon film, a silicon germanium film, a silicon dot, a metal dot, a silicon nitride film, a hafnium oxide film, an aluminum oxide film, or nano crystals by using a conventional material deposition method, such as CVD. Physical vapor deposition (PVD) can form those layers, while CVD is preferred to PVD since CVD has better step coverage properties.

Figure 7:
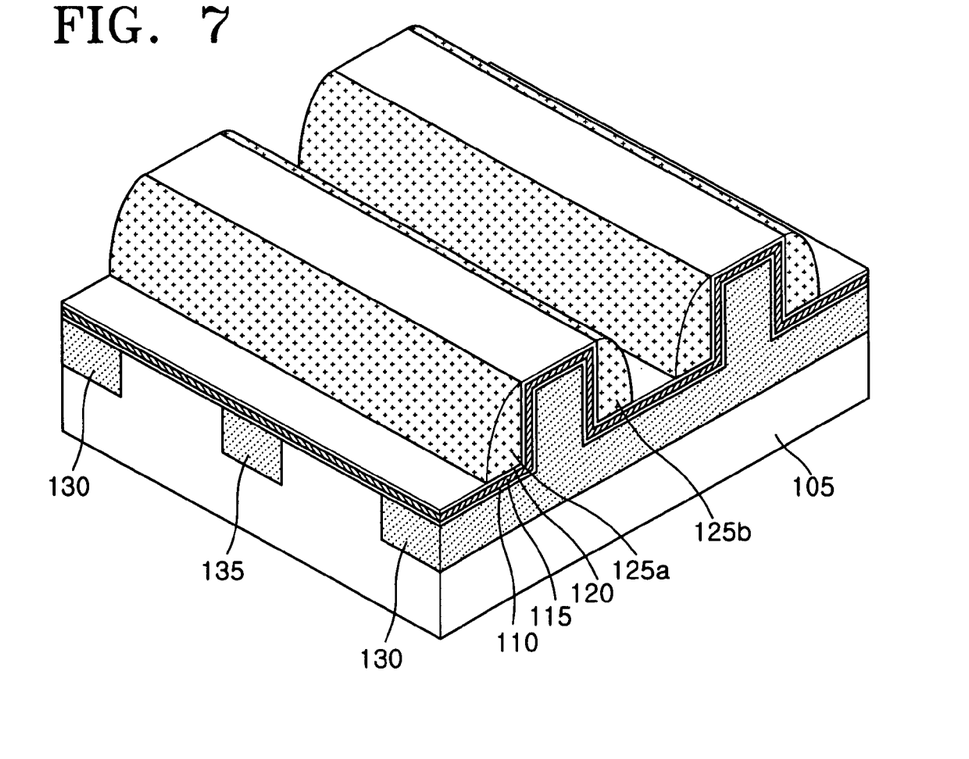

Referring to FIG. 7, a gate electrode layer (not illustrated) is deposited above the second insulation layer 120 and is anisotropically etched to form pairs of gate electrodes 125a and 125b. The gate electrodes 125a and 125b may be formed as spacers at both sidewalls of the fins 105'. The gate electrode layer is formed of, for example, polysilicon, metal, metal silicide or a combination of these materials by using a conventional material deposition method.

Next, selective etching of both ends of the gate electrodes 125a and 125b may be further included if further separation of the gate electrodes 125a and 125b from each other is necessary.

Figure 8:
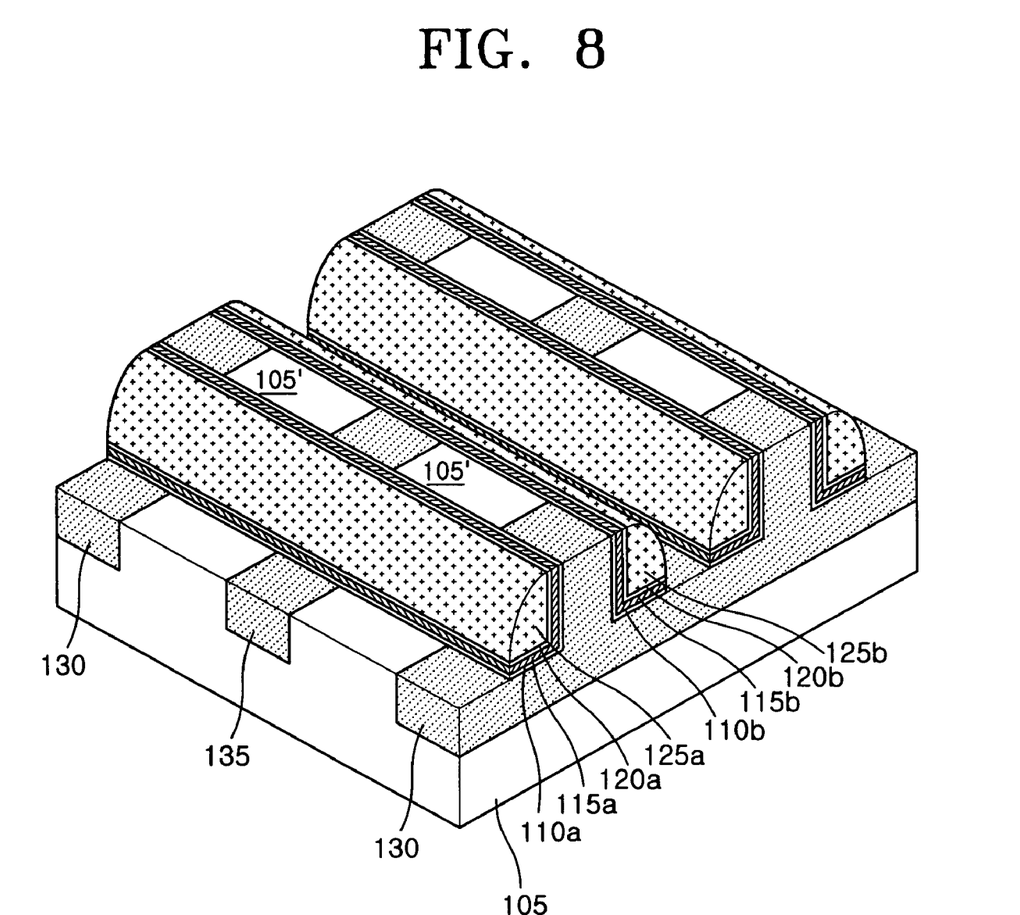

Referring to FIG. 8, the exposed second insulation layer 120, the storage node layer 115, and the first insulation layer 110 are selectively etched using the gate electrodes 125a and 125b as an etching protection mask. Accordingly, pairs of the first insulation layers 110a and 110b, pairs of the storage nodes 115a and 115b, and pairs of the second insulation layers 120a and 120b are formed with an 'L' shape between the gate electrodes 125a and 125b and the semiconductor substrate 105 having the fins 105'.

Since the gate electrodes 125a and 125b are simultaneously etched to have a predetermined thickness during etching, controlling the height of the fins 105' to be close to that of the gate electrodes 125a and 125b is possible.

Although not illustrated in the drawings, metal wire structures may be further formed by methods well known to those skilled in the art. Therefore, a structure similar to the non-volatile memory device 100 according to the first embodiment of the present invention can be formed.

Meanwhile, after forming gate electrodes 125a and 125b, metal wire structures can be formed without the operations illustrated in FIG. 8, thereby forming a structure similar to the non-volatile memory device 100' according to the second embodiment of the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A non-volatile memory device comprising:
a semiconductor substrate, doped with impurities of a first conductivity type, which has one or more fins defined by at least two separate trenches formed in the substrate, the fins extending along the substrate in a first direction;
pairs of gate electrodes formed as spacers at sidewalls of the fins, wherein the gate electrodes are insulated from the semiconductor substrate including the fins and extend parallel to the fins;
storage nodes between the gate electrodes and the fins, and insulated from the gate electrodes and the semiconductor substrate;
source regions and drain regions, which are doped with impurities of a second conductivity type, the source regions and drain regions being separately formed and both the source regions and the drain regions being formed at least at top and bottom surface portions of the fins and extending across the first direction of the fins; and
channel regions corresponding to the respective gate electrodes and extending between neighboring source and drain regions in the first direction, the channel regions at least at surface regions of the sidewalls of the top and bottom portions of the fins between the source and the drain regions, wherein the source regions and the drain regions are alternately disposed along the first direction.

2. The device of claim 1, further comprising oxide films between the storage nodes and the adjacent gate electrodes, and between the storage nodes and the semiconductor substrate.

3. The device of claim 1, wherein the storage nodes are formed of a material capable of storing electric charge comprising one selected from the group consisting of a polysilicon film, a silicon germanium film, a silicon dot, a metal dot, a silicon nitride film, a hafnium oxide film, an aluminum oxide film and nano crystals.

4. The device of claim 1, wherein the source regions and the drain regions are further formed at portions of the surface of the semiconductor substrate, and are connected to and extend across the fins.

5. The device of claim 1, wherein the channel regions are further formed at a surface region of the semiconductor substrate below the gate electrodes.

6. The device of claim 5, wherein the storage nodes are further formed between the gate electrodes and the semiconductor substrate, so that the storage nodes have an 'L' shaped cross-section.

7. The device of claim 1, wherein the storage nodes are further formed as a common layer on the semiconductor substrate having the fins.

8. The device of claim 7, wherein the storage nodes are insulated from the gate electrodes and the semiconductor substrate by silicon oxide films formed on and under the storage nodes.

9. A non-volatile memory device comprising:

a semiconductor substrate, doped with impurities of a first conductivity type, which has one or more fins defined by at least two separate trenches, the fins protruding from a top portion of the substrate and extending along the substrate in a first direction;

pairs of gate electrodes formed as spacers at sidewalls of the fins, wherein the gate electrode are insulated from the semiconductor substrate including the fins and extend parallel to the fins;

storage nodes having an 'L' shaped cross-section between the gate electrodes and the fins, and insulated from the gate electrodes and the semiconductor substrate;

source regions and drain regions, which are doped with impurities of a second conductivity type, the source regions and drain regions being separately formed and both the source regions and the drain regions being formed at top and bottom surface portions of the semiconductor substrate including at least the fins and extending across the first direction of the fins; and channel regions formed at surface regions of the sidewalls of the top and bottom portions of the fins between pairs of the source and the drain and on surface regions of the semiconductor substrate, the channel regions extending between neighboring source and drain regions in the first direction, wherein the source regions and the drain regions are alternately disposed along the first direction.

10. The device of claim 9, further comprising oxide films between the storage nodes and the adjacent gate electrodes, and between the storage nodes and the semiconductor substrate.

11. The device of claim 9, wherein the storage nodes are formed of a material capable of storing electric charge comprising one selected from the group consisting of a polysilicon film, a silicon germanium film, a silicon dot, a metal dot, a silicon nitride film, a hafnium oxide film, an aluminum oxide film and nano crystals.

12. The device of claim 9, wherein the storage nodes are further formed as a common layer on the semiconductor substrate having the fins.

13. The device of claim 12, wherein the storage nodes are insulated from the gate electrodes and the semiconductor substrate by silicon oxide films formed on and under the storage nodes.

* * * * *